(12) United States Patent
Armstrong et al.

(10) Patent No.: US 9,037,276 B2
(45) Date of Patent: May 19, 2015

(54) DYNAMIC SETTING OF INCREMENTS ON AN AMPLITUDE SCALE

(75) Inventors: Andrew A. Armstrong, Chandlers Ford (GB); Jonathan C. Mace, Providence, RI (US); Richard W. Pilot, Winchester (GB)

(73) Assignee: International Business Machines Corporation, Armonk, NY (US)

( * ) Notice: Subject to any disclaimer, the term of this patent is extended or adjusted under 35 U.S.C. 154(b) by 357 days.

(21) Appl. No.: 13/440,266

(22) Filed: Apr. 5, 2012

(65) Prior Publication Data

US 2012/0259441 A1 Oct. 11, 2012

(30) Foreign Application Priority Data

Apr. 6, 2011 (EP) ..................................... 11161373

(51) Int. Cl.
*H03G 3/32* (2006.01)
*H03G 3/10* (2006.01)
*G06F 17/00* (2006.01)

(52) U.S. Cl.
CPC ... *H03G 3/32* (2013.01); *H03G 3/10* (2013.01)

(58) Field of Classification Search
CPC ......... H03G 3/32; H03G 3/001; H03G 3/002; H03G 9/025; H03G 9/10; H03G 3/02; H04M 1/6016; H04R 2430/01
USPC .......................................................... 381/57
See application file for complete search history.

(56) References Cited

U.S. PATENT DOCUMENTS

| | | | |
|---|---|---|---|
| 4,479,237 A * | 10/1984 | Sugasawa ........................ | 381/57 |
| 5,907,622 A * | 5/1999 | Dougherty ...................... | 381/57 |
| 6,298,247 B1 | 10/2001 | Alperovich et al. | |
| 6,868,162 B1 * | 3/2005 | Jubien et al. ................... | 381/107 |
| 7,330,554 B2 * | 2/2008 | Lim et al. ....................... | 381/104 |
| 7,469,051 B2 | 12/2008 | Sapashe et al. | |
| 7,907,739 B2 * | 3/2011 | Chuo et al. ..................... | 381/109 |
| 8,249,277 B2 * | 8/2012 | Wong et al. .................... | 381/107 |
| 8,311,230 B2 * | 11/2012 | Petroff ............................ | 381/57 |
| 8,457,321 B2 * | 6/2013 | Daubigny ....................... | 381/57 |
| 2005/0090917 A1 * | 4/2005 | Ku ................................... | 700/94 |
| 2007/0206820 A1 * | 9/2007 | Ikawa ............................. | 381/104 |
| 2007/0262819 A1 * | 11/2007 | Jin et al. ......................... | 330/278 |
| 2008/0043996 A1 | 2/2008 | Dolph et al. | |
| 2009/0010442 A1 | 1/2009 | Usher et al. | |
| 2009/0022338 A1 * | 1/2009 | Wong et al. .................... | 381/109 |
| 2009/0076810 A1 * | 3/2009 | Matsuo .......................... | 704/225 |

(Continued)

OTHER PUBLICATIONS

Andrew F. Hobson; "Noise Activiated Automatic Volume Control"; Accession No. AD0721596; Report Date: Dec. 1970; p. 1; Public STINET (Scientific Technical Information Network) at the Defense Technical Information Center (DTIC).

*Primary Examiner* — Amal Zenati
*Assistant Examiner* — Thomas Maung
(74) *Attorney, Agent, or Firm* — Cantor Colburn LLP; Prentiss Johnson (57) ABSTRACT

The dynamic setting of an increment on an amplitude scale of an output signal includes receiving a user input requesting a change in an amplitude of the output signal. The amplitude of an external signal related to the output signal is determined, and a set of increments on the amplitude scale is calculated based upon the current amplitude of the output signal and the amplitude of the external signal. The existing set of increments are replaced with the newly calculated set of increments and the amplitude of the output signal is set to the next increment of the newly calculated set of increments.

9 Claims, 6 Drawing Sheets

(56) References Cited

U.S. PATENT DOCUMENTS

| | | |
|---|---|---|
| 2009/0097665 A1 | 4/2009 | L'Esperance et al. |
| 2009/0125303 A1* | 5/2009 | Tachibana .................... 704/226 |
| 2010/0290633 A1 | 11/2010 | Chen et al. |
| 2011/0026737 A1* | 2/2011 | Park .............................. 381/104 |
| 2011/0299705 A1* | 12/2011 | Chen ............................. 381/107 |

* cited by examiner

DYNAMIC SETTING OF INCREMENTS ON AN AMPLITUDE SCALE

PRIORITY

The present application claims priority to European Patent Application No. 11161373.3, filed Apr. 6, 2011, and all the benefits accruing therefrom under 35 U.S.C. §119, the contents of which in its entirety are herein incorporated by reference.

BACKGROUND

The present invention relates generally to an amplitude scale of an output signal, and more specifically, to dynamically setting the increments on an amplitude scale of an output signal.

Many portable audio devices such as MP3 players and smart phones deliver sound to the user of the device through headphones. In many cases, the input controls provided to the user are "up" and "down" controls. In situations where the designer of the device has chosen this input method, the designer typically divides the range of volumes available to the user into a number of fixed levels, or increments. When the user presses the "up" and "down" buttons on the device then the audio output volume traverses the increments on the scale.

Accordingly, the designer must decide how many increments to include for the volume scale. If the engineer puts on too many increments, then the volume scale will be too difficult for a user to traverse. Conversely, if the designer puts on too few increments, then there may be situations where a user cannot find a volume level appropriate for them because at one increment the volume is too quiet, and at the next increment the volume is too loud. A volume scale with a fine level of control is desirable by users, and so this tension is something that must be taken into account by the designer.

Increment spacing is further compounded when background noise is taken into account. In a perfect scenario, there would be no background noise, and so the user would happily be able to listen to the audio at any increment on the scale. However, there is often a level of background noise that must be taken into account. When this background noise is very loud, users will probably not care about the quiet volume options available to them.

In general, increments below the level of background noise are unnecessary. Often, there is a level of volume slightly above the background level, and after that the next available volume level is significantly further away, with no middle ground. The original designer of the volume scale may have intended there to be a nice even progression of volume levels, but due to the logarithmic nature of volume, the actual effect when taking background noise into account can produce a spacing of increments that is sub-optimal. Hence a hard-coded volume scale, while seemingly simple and sufficient, leaves much to be desired.

A further problem can occur when a user transitions between two locations with different levels of background noise. After transitioning, the level of volume selected by the user may no longer be the level of volume desired by the user. For example, in a quiet environment, such as waiting at a bus stop, the volume level set by the user might be at a quiet level. After transitioning to a noisier environment, such as getting onto a bus, the desired volume level might be further up the volume scale, to counteract the background noise.

A common and well-known example of dealing with this problem is the use of dynamic volume controls. These systems automatically adjust the volume of the audio playing based upon the level of background noise. It is a common feature found in modern cars. Dynamic volume controls also have a number of drawbacks. When an automatic volume adjustment is made, it is often noticeable and often unwanted or too extreme. However intelligent the system may be, an automatic adjustment typically presents a compromise to the user between maintaining an audible level of sound, but not making too drastic a change. A frequent issue is that the volume adjustment may be an unwanted change, and require user intervention.

SUMMARY

According to an exemplary embodiment of the present invention, a method of dynamically setting an increment on an amplitude scale of an output signal includes receiving a user input requesting a change in the amplitude of the output signal. The method also includes determining the amplitude of an external signal related to the output signal and calculating a set of increments on the amplitude scale based upon the current amplitude of the output signal and the amplitude of the external signal. The method further includes replacing the existing set of increments with the newly calculated set of increments and setting the amplitude of the output signal to the next increment of the newly calculated set of increments.

According to another exemplary embodiment of the present invention, a system for dynamically setting an increment on an amplitude scale of an output signal includes a control device configured to receive a user input requesting a change in the amplitude of the output signal. The system also includes an input device configured to determine the amplitude of an external signal related to the output signal. The system further includes a processor configured to calculate a set of increments on the amplitude scale based upon the current amplitude of the output signal and the amplitude of the external signal, replace the existing set of increments with the newly calculated set of increments, and set the amplitude of the output signal to the next increment of the newly calculated set of increments.

According to a further exemplary embodiment of the present invention, a computer program product for dynamically setting an increment on an amplitude scale of an output signal is provided. The computer program product includes a computer readable storage medium having computer readable code embodied therewith. The computer readable program code includes computer readable program code configured for receiving a user input requesting a change in the amplitude of the output signal and for determining the amplitude of an external signal related to the output signal. The computer program product also includes instructions for calculating a set of increments on the amplitude scale based upon the current amplitude of the output signal and the amplitude of the external signal and replacing the existing set of increments with the newly calculated set of increments. The computer readable program product also includes instructions for setting the amplitude of the output signal to the next increment of the newly calculated set of increments.

BRIEF DESCRIPTION OF THE SEVERAL VIEWS OF THE DRAWINGS

The present invention will now be described, by way of example only, with reference to exemplary embodiments, as illustrated in the following figures.

DETAILED DESCRIPTION

Exemplary embodiments of the present invention are directed to dynamically setting the increments on an amplitude scale of an output signal. In one embodiment, background noise is taken into consideration, and used to influence the new choice of increments. Embodiments do not directly modify the level of the actual output as only the increments available to be selected are modified. In addition, a user only becomes aware of a change if he chooses to navigate away from his current level of output. Embodiments described herein are applicable in any environment where a user is making selections of increments on an amplitude scale, whether this is the audio level of a device such as a MP3 player or the brightness setting on a laptop, or the like.

In embodiments in the audio domain, a microphone can be used to determine the background level of noise. The background noise is then used as a basis for readjusting the increments available to the user. Too many increments are generally undesirable as the scale then becomes difficult to navigate. The new increments are chosen so that the user has many options to choose from at desirable levels of output, and few to choose from at undesirable levels of output. The new increments are chosen so that the current output level is also an increment on the new scale. The increments can also be chosen so as to alleviate some of the logarithmic spacing issues mentioned above.

In an embodiment, an audio device has a microphone which it uses to pick up the level of background noise. A volume scale is constructed from this level of background noise, whereby successive points on the volume scale are calculated exponentially from this point. The user's current volume point is not affected by this change in scale. When the user presses the up or down buttons on the device, the next volume level will be selected based on this new exponential scale.

In one embodiment, the newly calculated set of increments has no increments at amplitudes below the determined amplitude of the external signal. It can be assumed that the user is not interested in levels of output that are below the level of the external signal. In the audio domain, this will be the level of the background noise, and the new set of increments can be configured so that there are no increments on the new amplitude scale that are below the level of the background noise, as the user will not want to select a volume level that is below the measured level of the background noise.

In exemplary embodiments, the number of increments in the newly calculated set of increments is equal in number to the number of increments in the existing set of increments. Since there are assumed to be good design reasons in the original selection of the number of increments in the amplitude scale, the new set of increments should maintain the same number of increments as the old set that is being replaced. Effectively all that happens is that the set of increments is rearranged so that the increments are focussed into a narrower range of interest that will better suit the user's current environment.

In one embodiment, dynamically setting the increments on an amplitude scale also includes detecting a direction of the change in the amplitude of the output signal in the user input so that the newly calculated set of increments has no increments in the opposite direction to the detected direction relative to the current amplitude of the output signal. If the user, in the audio domain for example, is adjusting the control to increase the volume of the audio device, then the amplitude scale can be configured so that there are no increments on the new scale that are below the current volume. Again, it can be safely assumed that the user is not interested in selecting an increment at a lower volume and so the limited number of increments can be better employed focussed in a range above the current volume level.

In one embodiment, the newly calculated set of increments that are in a zone directly above the determined amplitude of the external signal has an increased number of increments relative to the existing set of increments. The calculation of a new set of increments can be such that the new set of increments is focused into a specific zone that is above the determined amplitude of the measured external signal. For example, in the audio domain, such a zone (designated by a percentage for example) might currently have only one increment therein. The new set of increments will increase the number of increments in this specific zone. The zone might be defined as twenty percent above the current amplitude and the number of increments might be increased so that at least half of all available increments are placed within this zone. The zone could also be dependent upon the current selected level of the output and moved so that it is at least always above this level.

Figure 1A:
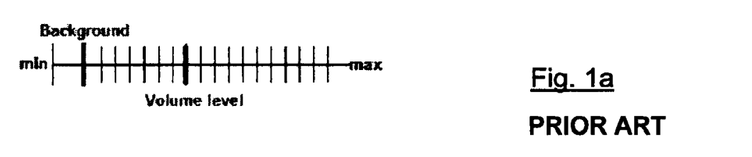
FIGS. 1a and 1b are diagrams of a volume scale before and after an increase in background noise level that may be implemented in accordance with an embodiment of the present invention.
Figure 1B:
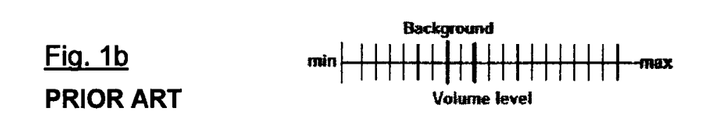

FIGS. 1a and 1b illustrate a volume scale from min to max that has a number of increments and shows the current level of the background noise and of the volume of an audio output. FIG. 1b shows the same scale as FIG. 1a, but after an increase in the background audio level. For example, FIGS. 1a and 1b could illustrate a car stereo system, as the car travels from a quiet location to a loud location. In FIG. 1a, the car is in a quiet environment and the user has the audio volume setting at a comparatively "loud" level. The car now transitions to a loud environment, and now the audio is at a low level relative to the background noise. The problem is that the audio is too quiet in the new environment. The user must manually adjust the volume setting, choosing from only a small number of suitable increments. The volume scale also suffers from logarithmic stretching effect.

Figure 2A:
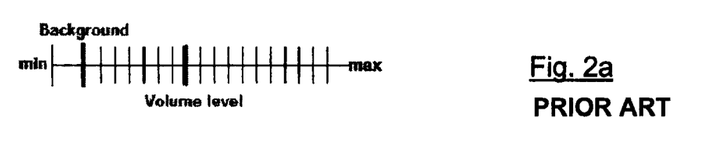
FIGS. 2a and 2b are diagrams of a volume scale similar to FIGS. 1a and 1b but using dynamic gain that may be implemented in accordance with an embodiment of the present invention.
Figure 2B:
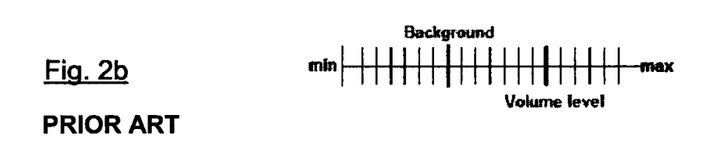

FIGS. 2a and 2b show a similar situation to that shown in FIGS. 1a and 1b, with a vehicle moving from a quiet to a noisier environment, but the audio system is using dynamic gain. In FIG. 2a, the car is in a quiet environment and the user has the audio at a comparatively "loud" level. In FIG. 2b, the audio setting is shown after the car transitions to a loud environment. The audio is adjusted automatically by the dynamic gain in order to compensate for new background noise level. However, for the user, the new volume is too loud. The problem for the user is that the audio has been adjusted too loud, and too noticeably. The new volume level must still be one of the relatively coarse, fixed increments on the volume scale. If the user chooses to manually adjust the volume, then there is still the problem of there being only a small number of suitable increments, and the presence of the logarithmic stretching effect.

Figure 3A:
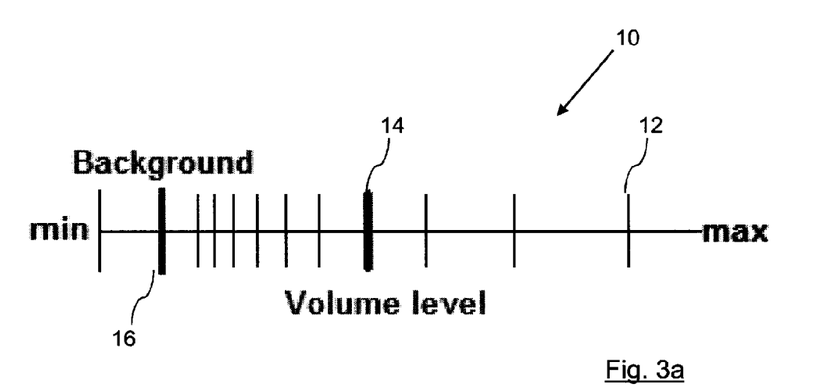
FIGS. 3a and 3b are diagrams of a volume scale similar to FIGS. 1a and 1b but using dynamic increment adjustment that may be implemented in accordance with an embodiment of the present invention.
Figure 3B:
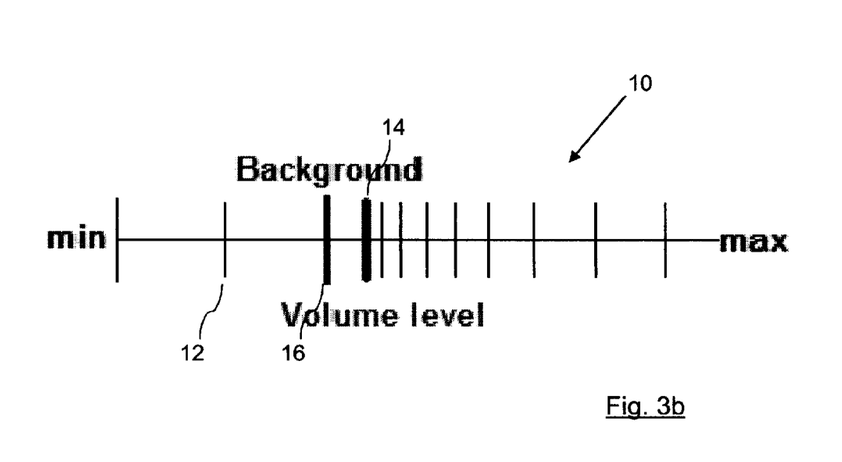

The use of dynamic increment adjustment in accordance with an embodiment is illustrated in FIGS. 3a and 3b. As in FIGS. 1a, 1b, 2a, and 2b, FIG. 3a shows the volume scale of an audio device in a vehicle in a quiet environment and FIG. 3b shows the same volume scale after the vehicle has moved to a noisier environment. The volume scale 10 is an amplitude scale of an output signal, in this case an audio signal. Increments 12 are set on the volume scale 10, and the user, when changing the amplitude of the audio signal will navigate between the increments 12. The level 14 shows the current amplitude of the audio signal and the level 16 shows the current amplitude of an external signal, here the background noise.

FIG. 3a shows the volume scale 10 when the car is in a quiet environment and the user has the audio set at a comparatively "loud" level 14. The car then transitions to a loud environment, the volume scale is as shown in FIG. 3b. Now the audio is at a low level 14 relative to the background level 16. The user has the same problem that the audio is too quiet in the new environment. The user must manually adjust the volume, but the user now has fine-grained control when choosing the new volume level. The increments 12 on the scale 10 have been dynamically set to take account of the change in the level of the background noise. The volume scale 10 also now compensates for the logarithmic effect.

A further example illustrates a situation where the dynamic setting of the increments is applicable and existing dynamic gain solutions do not provide adequate solutions. Consider the scenario where a user turns on his MP3 player to start using it. The user wants to set the volume to an appropriate level. The last time he used the device, it could have been in a very noisy or very quiet location. As such, the previous volume level is probably not appropriate for the user's new location. With dynamic setting of the increments, the volume scale is adjusted to give a suitable range of increments based on the background noise in the current location. In this scenario, a dynamic gain solution could be used, but the assumption no longer holds that the user wants to maintain the same relative level of volume as the last listening session.

Figure 4:
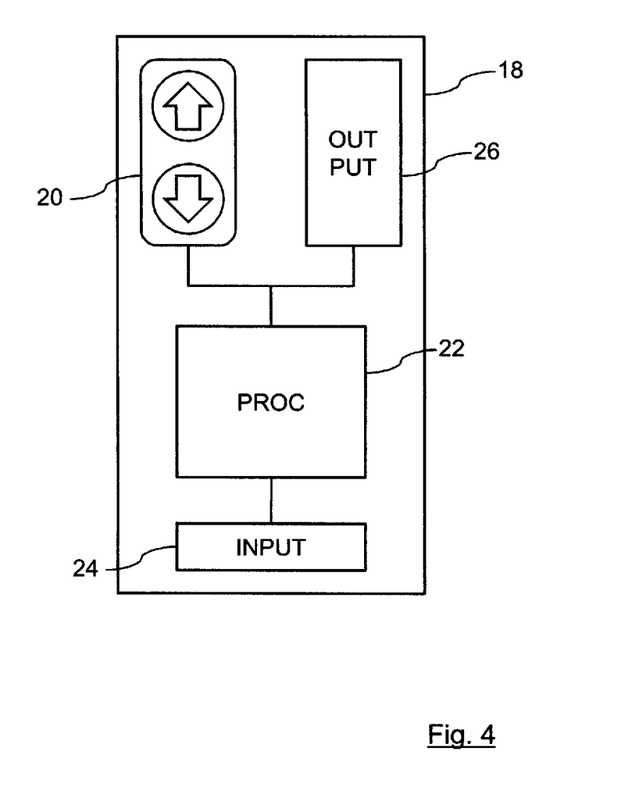
FIG. 4 is a schematic diagram of components of a MP3 player, in accordance with the prior art, and in which a preferred embodiment of the present invention may be implemented.

FIG. 4 shows an MP3 player 18, which includes a control device 20, a processor 22, an input device 24 such as a microphone and an output device 26 such as a speaker or headphone jack. The player 18 can be operated to dynamically set the increments on the amplitude scale of the output signal in accordance with embodiments described herein. In an embodiment, this process of dynamically setting the increments is triggered when the control device 20 receives a user input requesting a change in the amplitude of the output signal. For whatever reason, the user is operating either the up-button or down-button of the control device 20 to change the volume of the audio being output by the output device 26.

At this point, the input device 24 is configured to determine the amplitude of an external signal related to the output signal. In the context of an audio environment, the external signal is the background noise that will be measured by the microphone. The level of background noise is used in the calculation of the position of the increments on the amplitude scale that the user will be accessing through the control device 20. In exemplary embodiments, the measurement can be a simple point-in-time measurement of the current level of background noise, or can be an average calculated over a short period time, for example two seconds, in order to smooth out any local extremes.

In exemplary embodiments, the processor 22 is configured to calculate a new set of increments on the amplitude scale based upon the current amplitude of the output signal and the determined amplitude of the external signal. The processor 22 is also configured to replace the existing set of increments with the newly calculated set of increments and set the amplitude of the output signal to the next increment of the newly calculated set of increments. In this way a dynamic setting of the increments on the volume scale is performed by the device 18 once the user makes a change to the current volume, via the control means 20. The user will have a greater number of increments to choose from in the area of the volume scale that is most likely to be of interest.

The methods and systems described above can be applied in other situations outside of the audio domain. For example, laptop brightness controls can have their increments set dynamically, using feedback from the current ambient light levels. Many laptop computers have up and down brightness controls and also have a limited number of increments to choose from on the brightness scale. Ambient light levels can be extremely variable, and so in any one situation, the difference between increments on the brightness scale is very noticeable. A user will generally set the brightness level on a laptop display screen relative to the ambient light levels and information about the ambient light can be used to dynamically set the increments.

In this scenario, a light sensor can be used to determine the ambient light levels, and adjust the available brightness notches accordingly. Generally, a user would not want any of the dark settings if he is outside in bright light, but likewise he would not want the ultra-bright settings if he was inside in the dark. Therefore, when the user presses either the up or down control on the brightness setting, then the spacing of the increments on the screen brightness are recalculated using information about the ambient light level, which could be a single measure or an average over a short period of time. The user is then presented with an amplitude scale that has increments more suitably located.

Figure 5:
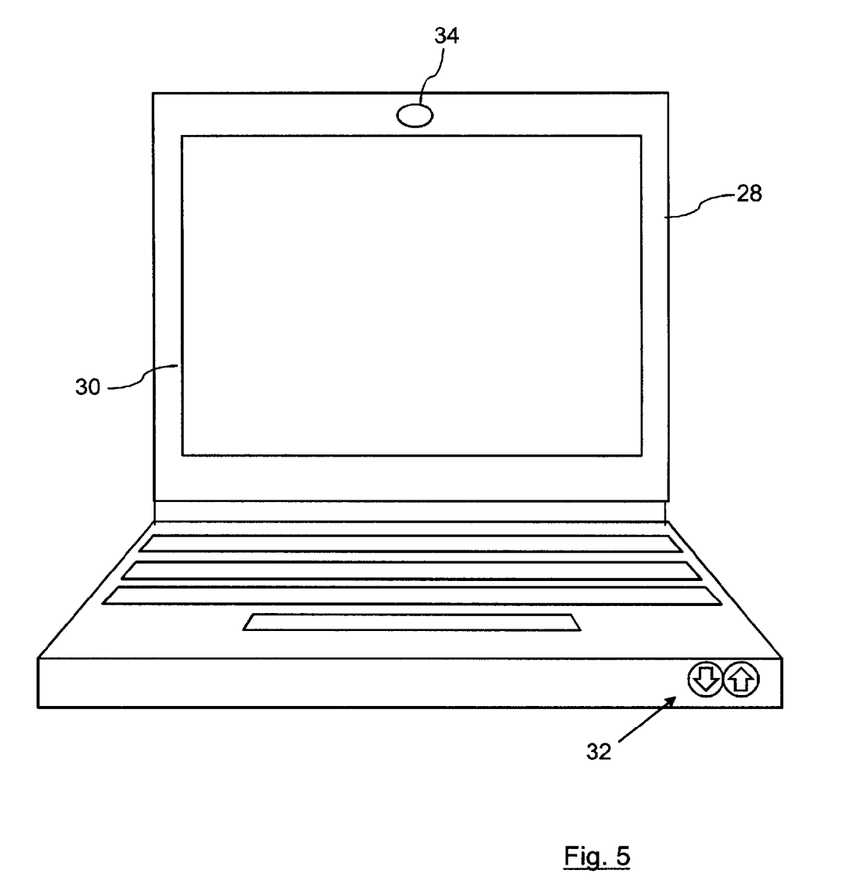
FIG. 5 is a schematic diagram of a laptop computer, in accordance with the prior art, and in which a preferred embodiment of the present invention may be implemented.

FIG. 5 shows an example of a laptop 28 that employs this feedback system in accordance with an embodiment. The brightness of the display screen 30 is controlled by the user via a dedicated hardware control 32, which provide up and down buttons for a user to press. A light detector 34 is able to determine the ambient light level. The laptop's processor can run a computer program that will perform the algorithm to set the increments on the brightness scale for the display screen 30. Whenever the user presses either button that make up the control 32, then the software can recalculate the increments on the brightness scale, thereby providing the user with a more desirable set of brightness levels that can be chosen, with regard to the current level of ambient light.

A further implementation of the system can be used to set the increments for the text size in applications such as Internet browsers. Browsers offer users the option to adjust the size of displayed text. The coarseness of these scales is sometimes rather extreme, for example some browsers offer only three levels from which a user may choose. Keyboard controls are often provided to increase and decrease the text size as appropriate. In an exemplary embodiment, a sensor could be used to detect the user's distance from the screen. This is an example where the full range of text sizes is sometimes available to the user in a settings panel, but a quick way of adjusting text size resorts to a basic up and down control system.

Figure 6:
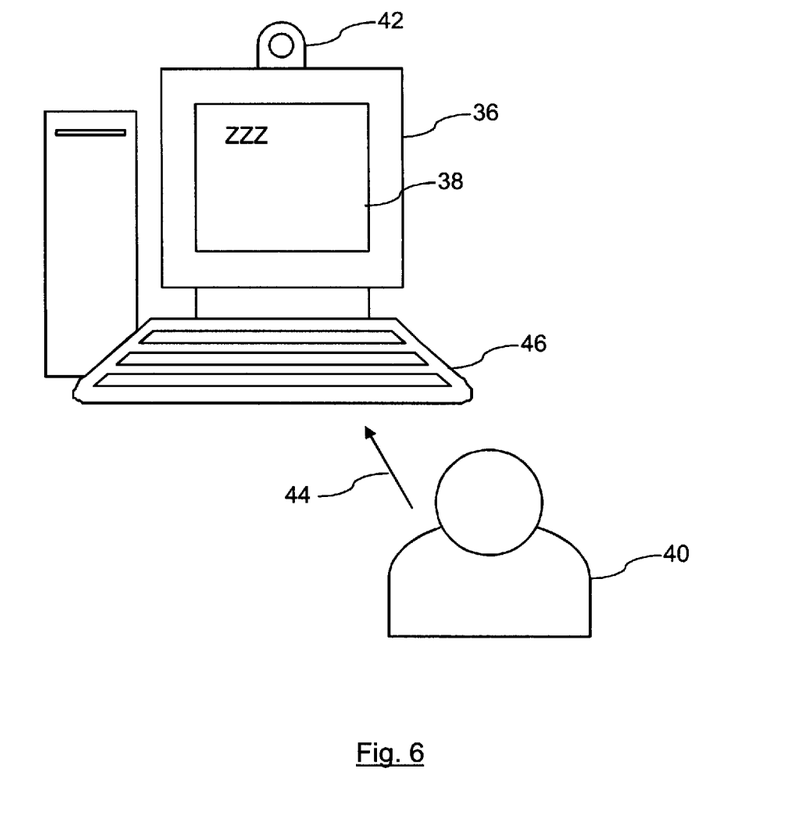
FIG. 6 is a schematic diagram of a desktop computer, in accordance with the prior art, and in which a preferred embodiment of the present invention may be implemented.

FIG. 6 shows an example of a computer 36 in accordance with an embodiment that includes a display screen showing text with a defined height size. A user 40 is interacting with the computer 36 and a webcam 42 is able to determine the distance 44 of the user 40 from the computer 36. Other technologies could be used to determine the user's distance from the computer 36, but the images from the webcam 42 can be processed to locate the user 40 within the image and determine the size of the user 40 in the image and make a corresponding approximation of the user's distance 44 from the computer 36. Infra-red or stereo camera systems could also be used to determine the distance 44.

The user 40 interacts with the computer 36 via a keyboard 46, which provides a way of controlling the text size on the screen 38. Once the user 40 presses a key on the keyboard 46 to change the text size either up or down, the user's distance 44 from the computer 36 can be used to set the increments in the text height to provide a more appropriate range of possible text sizes in which the user would be interested. For example, if the user is relatively close to the screen 38 and presses a key to indicate that the size of the text should be reduced, then the set of increments offered to the user could be clustered around a smaller size of text.

Figure 7:
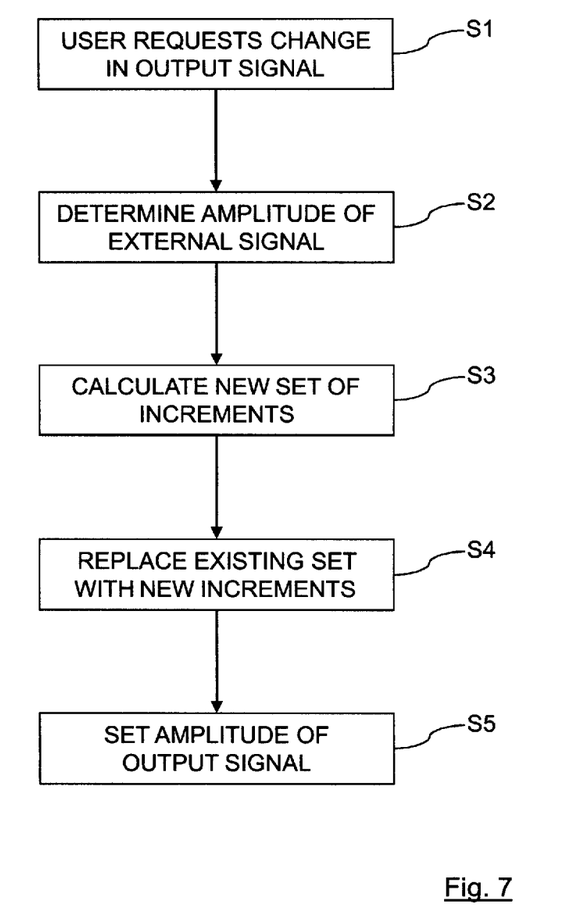
FIG. 7 is a flowchart of a method of dynamically setting the increments of an amplitude scale in accordance with an embodiment of the present invention.

FIG. 7 summarizes a method of dynamically setting the increments on the amplitude scale in accordance with an embodiment. The method includes: receiving a user input requesting a change in the amplitude of the output signal at block S1, determining the amplitude of an external signal related to the output signal at block S2, calculating a set of increments on the amplitude scale based upon the current amplitude of the output signal and the determined amplitude of the external signal at block S3, replacing the existing set of increments with the newly calculated set of increments at block S4, and setting the amplitude of the output signal to the next increment of the newly calculated set of increments at block S5.

For block S3, calculating the increments for the new scale, an implementing engineer would choose an appropriate function to calculate the increments specifically for the embodiment of the process. An example would be to choose them exponentially, in order to counteract the logarithmic stretching effect in the audio domain. Compression or equalization could also be applied at this step. For block S2, determining the volume of background noise, an existing technique can be used, such as calculating an average of the background noise over a period of time, for example two seconds.

Embodiments described herein provide benefits above existing solutions for a number of reasons. For example, compared to a static volume scale, the dynamic setting of increments is an improvement because the user is given a finer level of control without having too many increments to navigate between. Embodiments of the system described herein, are applicable in the same scenarios as dynamic volume controls, but approach the problem from a different angle. Embodiments do not force any change upon the user. However, if the user does wish to modify the volume, the increments available to them are appropriate and he can easily choose a specific level of output suitable for the current environment.

What is claimed is:

1. A method of dynamically setting an increment on an amplitude scale of an output signal, the method comprising:
 receiving a user input requesting a change in an amplitude of the output signal;
 determining an amplitude of an external signal related to the output signal;
 calculating a set of increments on the amplitude scale exponentially from a current amplitude of the output signal, wherein the newly calculated set of increments has no increments at an amplitude below the amplitude of the external signal;
 detecting a direction of the change in the amplitude of the output signal in the user input, wherein the newly calculated set of increments has no increments in the opposite direction to the detected direction relative to the current amplitude of the output signal;
 replacing an existing set of increments with the newly calculated set of increments; and
 setting the amplitude of the output signal to a next increment of the newly calculated set of increments.

2. A method according to claim 1, wherein the number of increments in the newly calculated set of increments is equal in number to the number of increments in the existing set of increments.

3. A method according to claim 1, wherein the newly calculated set of increments in a zone directly above the amplitude of the external signal has an increased number of increments relative to the existing set of increments.

4. A system for dynamically setting an increment on an amplitude scale of an output signal, the system comprising:
 a control device configured to receive a user input requesting a change in an amplitude of the output signal;
 an input device configured to determine an amplitude of an external signal related to the output signal; and
 a processor configured to:
  calculate a set of increments on the amplitude scale exponentially from a current amplitude of the output signal, wherein the newly calculated set of increments has no increments at an amplitude below the amplitude of the external signal;
  detect a direction of the change in the amplitude of the output signal in the user input, wherein the newly calculated set of increments has no increments in the opposite direction to the detected direction relative to the current amplitude of the output signal;
  replace an existing set of increments with the newly calculated set of increments; and
  set the amplitude of the output signal to a next increment of the newly calculated set of increments.

5. A system according to claim 4, wherein the number of increments in the newly calculated set of increments is equal in number to the number of increments in the existing set of increments.

6. A system according to claim 4, wherein the newly calculated set of increments in a zone directly above the amplitude of the external signal has an increased number of increments relative to the existing set of increments.

7. A computer program product for dynamically setting an increment on an amplitude scale of an output signal, the computer program product comprising:
 a non-transitory computer readable storage medium having computer readable program code embodied therewith, the computer readable program code comprising:
 computer readable program code configured for:
  receiving a user input requesting a change in an amplitude of the output signal;
  determining an amplitude of an external signal related to the output signal;
  calculating a set of increments on the amplitude scale exponentially from a current amplitude of the output signal, wherein the newly calculated set of increments has no increments at an amplitude below the amplitude of the external signal;

detecting a direction of the change in the amplitude of the output signal in the user input, wherein the newly calculated set of increments has no increments in the opposite direction to the detected direction relative to the current amplitude of the output signal;

replacing an existing set of increments with the newly calculated set of increments; and setting the amplitude of the output signal to a next increment of the newly calculated set of increments.

8. A computer program product according to claim 7, wherein the number of increments in the newly calculated set of increments is equal in number to the number of increments in the existing set of increments.

9. A computer program product according to claim 7, wherein the newly calculated set of increments in a zone directly above the amplitude of the external signal has an increased number of increments relative to the existing set of increments.

* * * * *